United States Patent [19]
Hardy et al.

[11] Patent Number: 5,999,839
[45] Date of Patent: Dec. 7, 1999

[54] ARTERIAL MRI WITH CHEMICAL-SHIFT NULLING

[75] Inventors: Christopher Judson Hardy, Schenectady; Charles Lucian Dumoulin, Ballston Lake; Erika Schneider, Rexford, all of N.Y.

[73] Assignee: General Electric Company, Schenectady, N.Y.

[21] Appl. No.: 09/016,569

[22] Filed: Jan. 30, 1998

[51] Int. Cl.⁶ ..................................................... A61B 5/055
[52] U.S. Cl. ........................ 600/413; 600/419; 600/420; 324/306
[58] Field of Search ..................................... 600/410, 413, 600/419, 420; 324/306, 307, 309

[56] References Cited

U.S. PATENT DOCUMENTS

| | | |
|---|---|---|
| 5,447,156 | 9/1995 | Dumoulin et al. . |
| 5,469,059 | 11/1995 | Dumoulin . |
| 5,479,928 | 1/1996 | Dumoulin et al. . |
| 5,509,412 | 4/1996 | Bahn ........................................ 600/419 |
| 5,588,431 | 12/1996 | Mani et al. .............................. 600/419 |

OTHER PUBLICATIONS

CJ Hardy, CL Dumoulin, RD Darrow, "MR Coronary Angiography Using a Hybrid Multislice Technique with Fat/muscle Suppression and Fluoroscopic Localization.", International Society For Magnetic Resonance In Medicine, 5th Meeting, Vancouver, Apr. 12–18, 1997. p. 440.

*Primary Examiner*—Ruth S. Smith
*Attorney, Agent, or Firm*—Marvin Snyder; Douglas E. Stoner

[57] ABSTRACT

A magnetic resonance (MR) imaging method uses chemical shift and/or slice selective inversion pulse to create angiograms of coronary arteries. In one embodiment blood is doped with a contrast enhancement agent and a sequence of slice selective and chemical shift selective inversion pulses are applied. Detection RF pulses then generate an image signal. In another embodiment two sequential chemical shift inversion pulses are applied followed by detection RF pulses for imaging.

29 Claims, 9 Drawing Sheets

ARTERIAL MRI WITH CHEMICAL-SHIFT NULLING

FIELD OF THE INVENTION

The present invention relates to medical imaging of blood vessels, and more particularly concerns the use of magnetic resonance to perform such imaging.

DESCRIPTION OF RELATED ART

Angiography, or the imaging of vascular structures, is very useful in diagnostic and therapeutic medical procedures. In X-ray angiography, an invasive device is used to place a bolus of x-ray opaque liquid into a patient's vasculature. While the bolus is within the patient, a series of X-ray images is obtained which highlight the X-ray absorbing liquid.

X-ray angiography carries several significant risks to the patient including discomfort and adverse reactions. While conventional X-ray fluoroscopes are designed to minimize X-ray dosage, some procedures can be very long and the accumulated X-ray dose to the subject can become significant. The long term exposure of the attending medical staff is of even greater concern since they regularly participate in these procedures. Consequently, it is desirable to reduce or eliminate the X-ray dose during these procedures.

X-ray angiography typically produces a single two-dimensional projection image. Information concerning the depth of an object within the field-of-view is not available to the operator. It is often desirable to obtain this information during diagnostic and therapeutic procedures.

Magnetic resonance (MR) imaging procedures for the imaging of vascular structures have recently become available. MR angiography is performed with a variety of methods, all of which rely on one of two basic phenomena. The first phenomenon arises from changes in longitudinal spin magnetization as blood moves from one region of the patient to another. Methods that make use of this phenomenon have become known as "in-flow" or "time-of-flight" methods. A commonly used time-of-flight method is three-dimensional time-of-flight angiography. With this method, a region of interest is imaged with a relatively short repetition time, TR, and a relatively strong excitation radio-frequency (RF) pulse. This causes the MR spins within the field-of-view to become saturated and give weak MR response signals. Blood flowing into the field-of-view, however, enters in a fully relaxed state. Consequently, this blood gives a relatively strong MR response signal, until it too becomes saturated. Because of the nature of blood vessel detection with time-of-flight methods, the stationary tissue surrounding the vessel cannot be completely suppressed. In addition, slowly moving blood, and blood that has been in the imaged volume for too long, becomes saturated and is poorly imaged.

A second type of MR angiography is based on the induction of phase shifts in transverse spin magnetization. These phase shifts are directly proportional to velocity and are induced by flow-encoding magnetic field gradient pulses. Phase-sensitive MR angiography methods exploit these phase shifts to create images in which the pixel intensity is a function of blood velocity. While phase-sensitive MR angiography can easily detect slow flow in complicated vessel geometries, it will also detect any moving tissue within the field-of-view. Consequently, phase-sensitive MR angiograms of the heart have artifacts arising from the moving heart muscle and from the moving pools of blood in the heart chambers.

One example, an MR method using an invasive device for generating angiograms is shown in U.S. Pat. No. 5,447,156. Another MR invasive method that uses highly magnetized fluid is shown in U.S. Pat. No. 5,479,925. One non-invasive MR method relies upon detecting acceleration and velocity. That method is described in U.S. Pat. No. 5,469,059.

MR imaging may use inversion recovery pulse sequences for measuring the $T_1$ of a sample. The $T_1$ of a sample is the amount of time it takes for the longitudinal magnetization to return to its equilibrium value after an RF pulse disturbs the longitudinal magnetization. Recently, inversion recovery methods have been used to provide $T_1$ contrast in conventional soft-tissue MR imaging. In both high resolution and imaging applications an RF pulse inverts the spin magnetization of the nuclei in a sample. A detection RF pulse, typically having a flip angle of 90°, is then applied at a selected time after the inversion pulse to measure the amount of longitudinal magnetization. The amount of longitudinal magnetization can be measured from the signal intensity in an image formed in response to the detection RF pulse. By applying detection pulses at a number of selected delay times, the exponential return of spin magnetization to the steady state after inversion can be quantified and the T1 of the sample can be determined.

Slice-selective inversion pulses have been used to suppress selected tissues in conventional MR imaging. For example, cross-sectional images of anatomy have been obtained with a slice-selective inversion pulse applied before data acquisition so that the fat is suppressed, while muscle is left relatively unaffected, and vice-versa. Chemical-shift selection inversion pulses have also been used to suppress selected tissues. However, the two methods have not been used together to provide an angiogram nor have two chemical shift-selective pulses been used together to provide vascular or cardiac images.

SUMMARY OF THE INVENTION

The invention provides a method and an apparatus for magnetic resonance imaging of the patient's heart and generating an image that shows blood in the cardiac chambers and in the coronary vessels while suppressing the signal from the myocardium (muscle) and lipid tissue. As an optional first step, the method treats the blood with a contrast agent by doping the blood with a compound containing gadolinium or some similar MR contrast agent. Then the subject is placed in a substantially uniform magnetic field that orients the longitudinal magnetization of the myocardial tissue, the lipid tissue and the blood in the direction of the magnetic field. The method uses two sequential inversion pulses followed by a series of detection RF pulses. The inversion pulse is a radio-frequency (RF) pulse that rotates the longitudinal magnetization of the selected components 180°. The detection RF pulse is an RF pulse that rotates the longitudinal magnetization of the selected components at 90°. The first inversion pulse is applied to the subject. The first inversion pulse inverts the longitudinal magnetization of at least two of the myocardium, lipid and blood components. The second inversion pulse is applied for inverting the longitudinal magnetization of the lipid tissue. Finally, one or more detection RF pulses are applied to measure the remaining amount of longitudinal magnetization of the blood. The amount of longitudinal magnetization is displayed as signal intensity in one or more images acquired in response to the detection RF pulse.

In one embodiment of the invention, the first inversion pulse is a slice-selective inversion pulse that inverts the longitudinal magnetization of the myocardial tissue, lipid tissue and blood. In another embodiment of the invention, the first inversion pulse is a first chemical shift-selective inversion pulse for inverting the longitudinal magnetization of the blood and the muscle tissue. With both embodiments, at least two of the components are inverted by the first inversion pulse. In both embodiments, the second inversion pulse is timed so that both the lipid and the myocardial tissue longitudinal magnetization will be about zero and the blood magnetization will be approaching normal equilibrium when an image capturing operation is commenced.

OBJECTS OF THE INVENTION

It is an object of the present invention to provide a method for non-invasive MR imaging of coronary arteries. It is another object of the present invention to provide a non-invasive MR imaging of coronary arteries using chemical shift-selective inversion pulses. It is still a further object of the invention to provide non-invasive MR imaging of coronary arteries using slice-selective and chemical shift-selective inversion pulses.

BRIEF DESCRIPTION OF THE DRAWINGS

The features of the invention believed to be novel are set forth with particularity in the impending claims. The invention itself, however, both as to organization and method of operation, together with further objects and advantages thereof, may best be understood by reference to the following description taken in conjunction with the accompanying drawing in which:

DETAILED DESCRIPTION OF THE INVENTION

Figure 1:
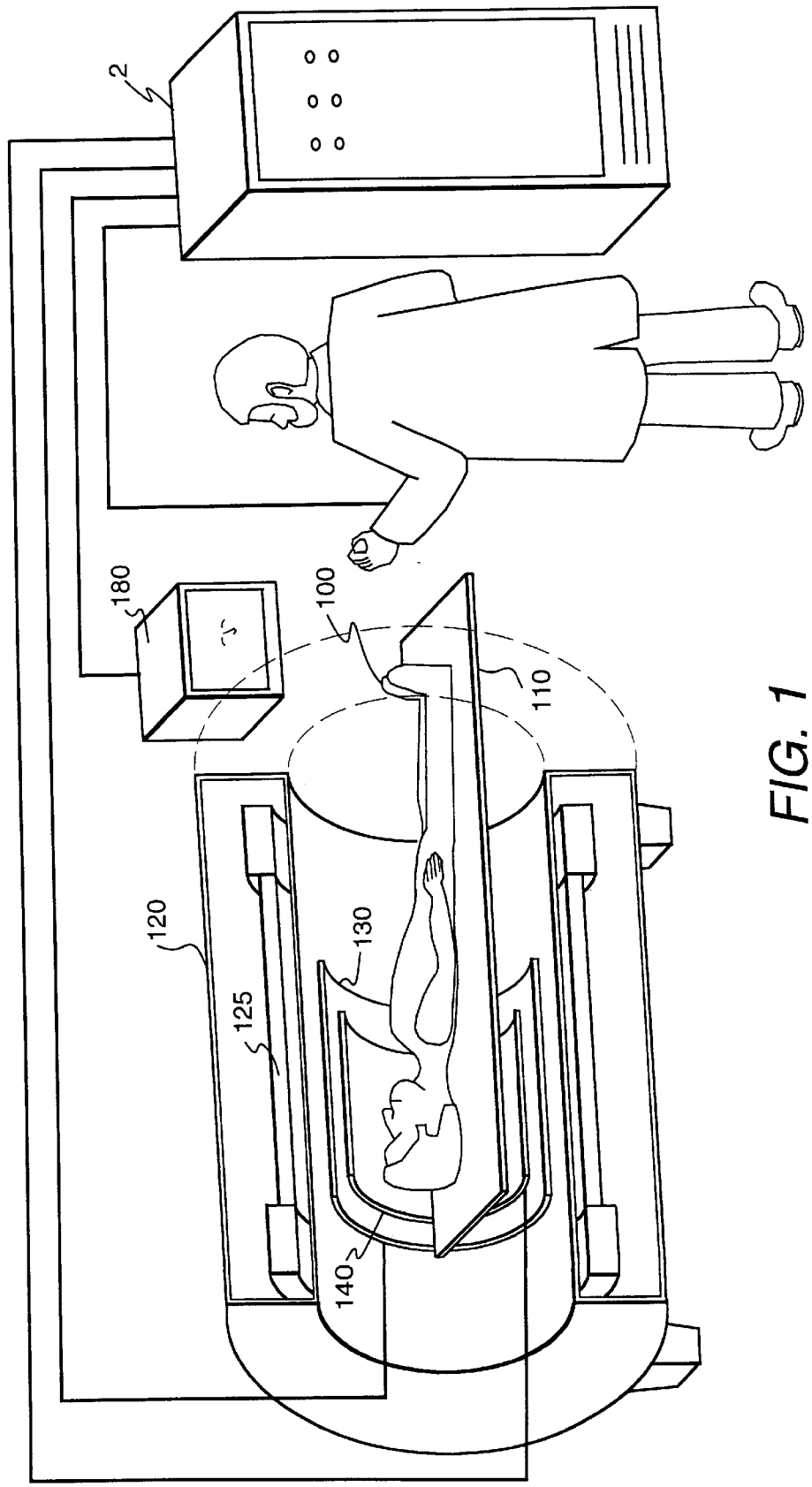
FIG. 1 is a perspective view of a subject patient undergoing a non-invasive MR coronary artery imaging operation.

In FIG. 1, a subject 100 is placed on a support table 110 and positioned in a homogeneous magnetic field generated by a magnet 125 encased in a magnet housing 120. Magnet 125 and magnet housing 120 have cylindrical symmetry and are shown sectioned in half to reveal the position of subject patient 100. A region of interest of subject 100 is located in the approximate center 150 of the bore of magnet 125. Subject 100 is surrounded by a set of cylindrical magnetic field gradient coils 130 which create magnetic field gradients of predetermined strength at predetermined times according to predetermined MR pulse sequences, described later. Gradient coils 130 generate magnetic field gradients in three mutually orthogonal directions. At least one external radio-frequency (RF) coil 140 (only one is shown in FIG. 1) also surrounds the region of interest of subject 100. In FIG. 1, RF coil 140 has a cylindrical shape with a diameter sufficient to encompass the entire subject. Other geometries, such as smaller cylinders specifically designed for imaging the head or an extremity, can be used in alternative embodiments. Non-cylindrical external radio-frequency coils, such as surface coils, may also be used. External RF coil 140 radiates radio-frequency energy into subject 100 at predetermined times and with sufficient power at a predetermined frequency so as to nutate a population of nuclear magnetic spins, hereinafter referred to as 'spins', of subject 100 in a fashion well known to those skilled in the art. External RF coil 140 can also act as a receiver, detecting the MR response signals which are stimulated by nutation, if desired.

The nutation of the spins causes them to resonate at the Larmor frequency. The Larmor frequency for each spin is directly proportional to the strength of the magnetic field experienced by the spin. This field strength is the sum of the static magnetic field generated by magnet 125 and the local field generated by magnetic field gradient coil 130.

Figure 2:
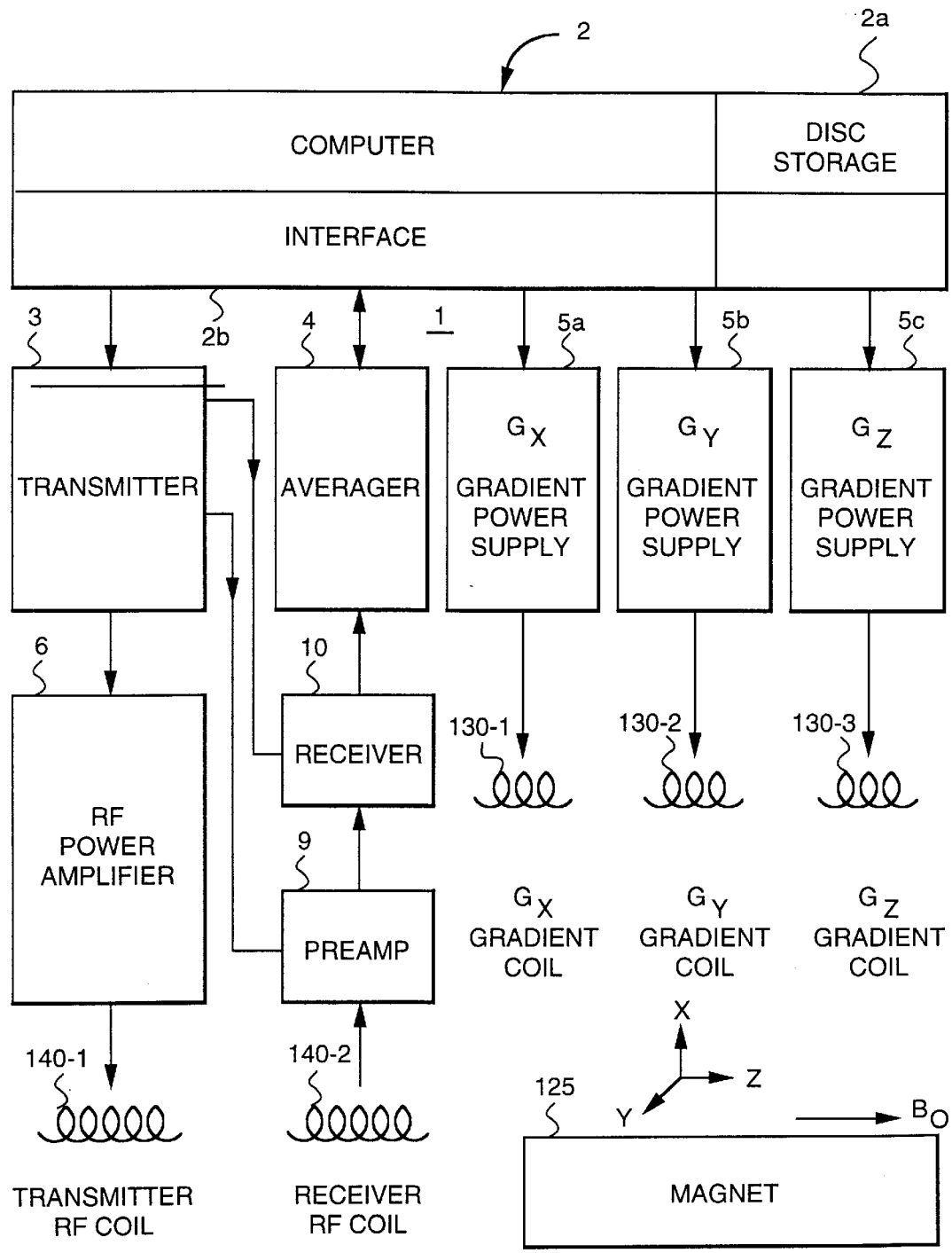
FIG. 2 is a simplified block diagram of a MR imaging system suitable for use with the present invention.

FIG. 2 is a simplified block diagram of the major components of a magnetic resonance (MR) imaging system suitable for use with the invention described herein. The system is made up of a general purpose mini-computer 2 which is functionally coupled to a disk storage unit 2a and an interface unit 2b. A radio-frequency (RF) transmitter 3, signal averager 4, and gradient power supplies 5a, 5b, and 5c, are all coupled to computer 2 through interface unit 2b. Gradient power supplies 5a, 5b, and 5c energize gradient coils 130-1, 130-2, and 130-3 to create magnetic field gradients Gx, Gy, and Gz, respectively, in the "X", "Y", and "Z" directions respectively, over a subject to be imaged. RF transmitter 3 is gated with pulse envelopes from computer 2 to generate RF pulses having the required modulation to excite an MR response signal from a subject. The RF pulses are amplified in an RF power amplifier 6 to levels varying from 100 watts to several kilowatts, depending on the imaging method, and applied to a RF coil 140. If desired, there may be separate transmitter and receiver coils 140-1, 140-2. The higher power levels are necessary for large sample volumes, such as in whole body imaging, and where short duration pulses are required to excite larger MR frequency bandwidths.

The MR response signal is sensed by a receiver coil 140-2 amplified in a low noise preamplifier 9 and passed to receiver 10 for further amplification, detection, and filtering. The signal is then digitized for averaging by signal averager 4 and for processing by computer 2. Preamplifier 9 and receiver 10 are protected from the RF pulses during transmission by active gating or by passive filtering.

Computer 2 provides gating and envelope modulation for the MR pluses, blanking for the preamplifier and RF power amplifier, and voltage waveforms for the gradient power supplies. The computer also performs data processing such as Fourier transformation, image reconstruction, data filtering, imaging display on a monitor 180 (FIG. 1), and storage functions (all of which are conventional and outside the scope of the present invention).

Transmitter coil 140-1 and receiver RF coil 140-2, if desired, may comprise a single coil 140. Alternatively, two separate coils that are electrically orthogonal may be used. The latter configuration has the advantage of reducing RF pulse breakthrough into the receiver during pulse transmission. In both cases, the coils are orthogonal to the direction of a static magnetic field B0 produced by a magnet means 125. The magnet, RF and gradient coils, and imaging subject may be isolated from the remainder of the system by enclosure in a RF shielded cage.

Magnetic field gradient coils 130-1, 130-2 and 130-3 are necessary to provide gradients Gx, Gy, and Gz, respectively, that are monotonic and linear over the sample volume. Multi-valued gradient fields cause a degradation in the MR response signal data, known as aliasing, which leads to severe image artifacts. Nonlinear gradients cause geometric distortions of the image.

Figure 3:
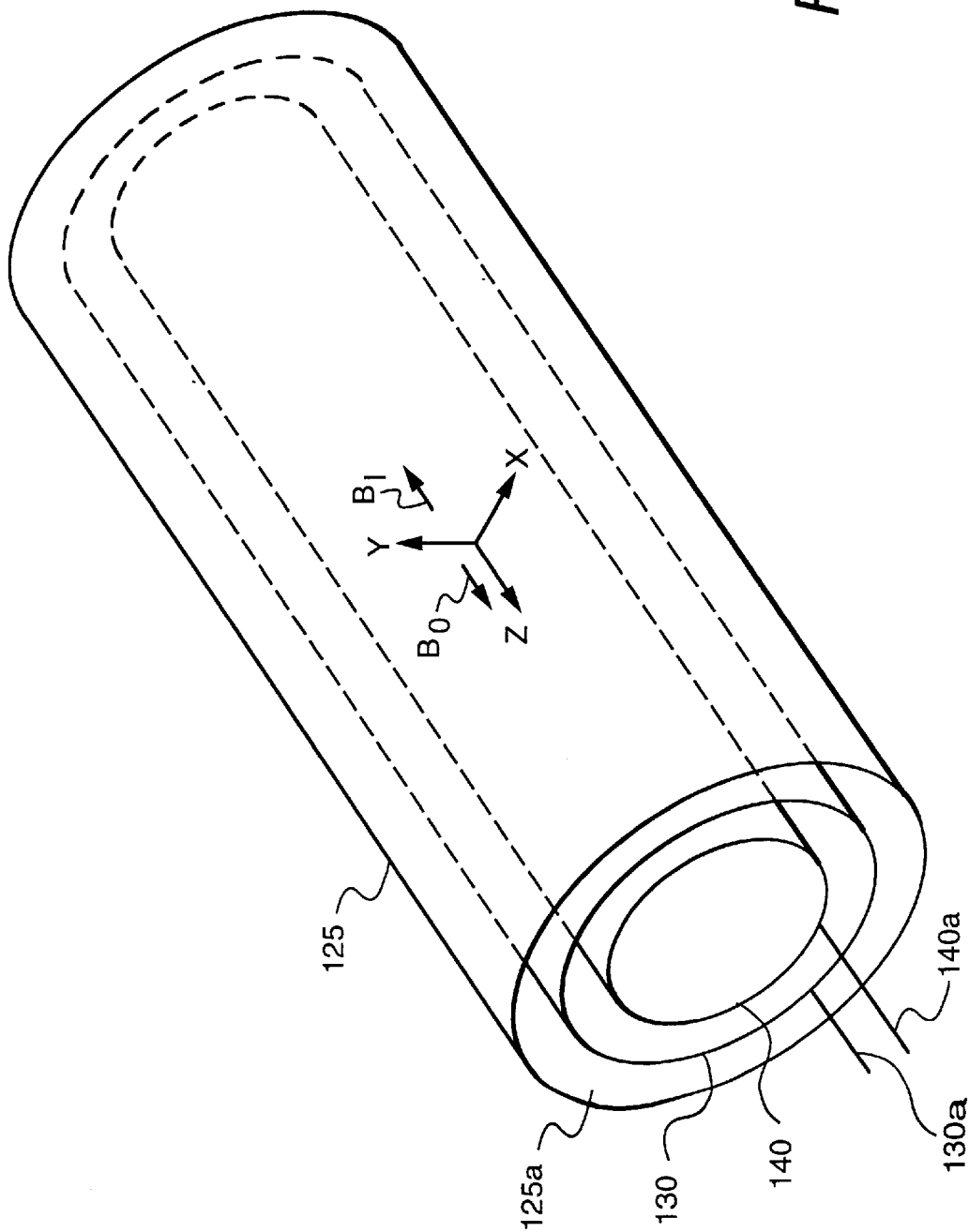
FIG. 3 is a more detailed diagram of the magnetic assembly of FIG. 1.

Magnet assembly 125, shown schematically in FIG. 3, has a central cylindrical bore 125a which generates a static magnetic field B0, typically in the axial, or Z Cartesian coordinate direction. A set of coils 130, such as coils 130-1, 130-2, and 130-3 of FIG. 1, received electrical signals via input connections 130a, and provide at least one gradient magnetic field within the volume of bore 125a. Also situated within bore 125a is an RF coil 140, which receives RF energy via at least one input cable 140a, to provide an RF magnetic field B1, typically in the X-Y plane.

Figure 4:
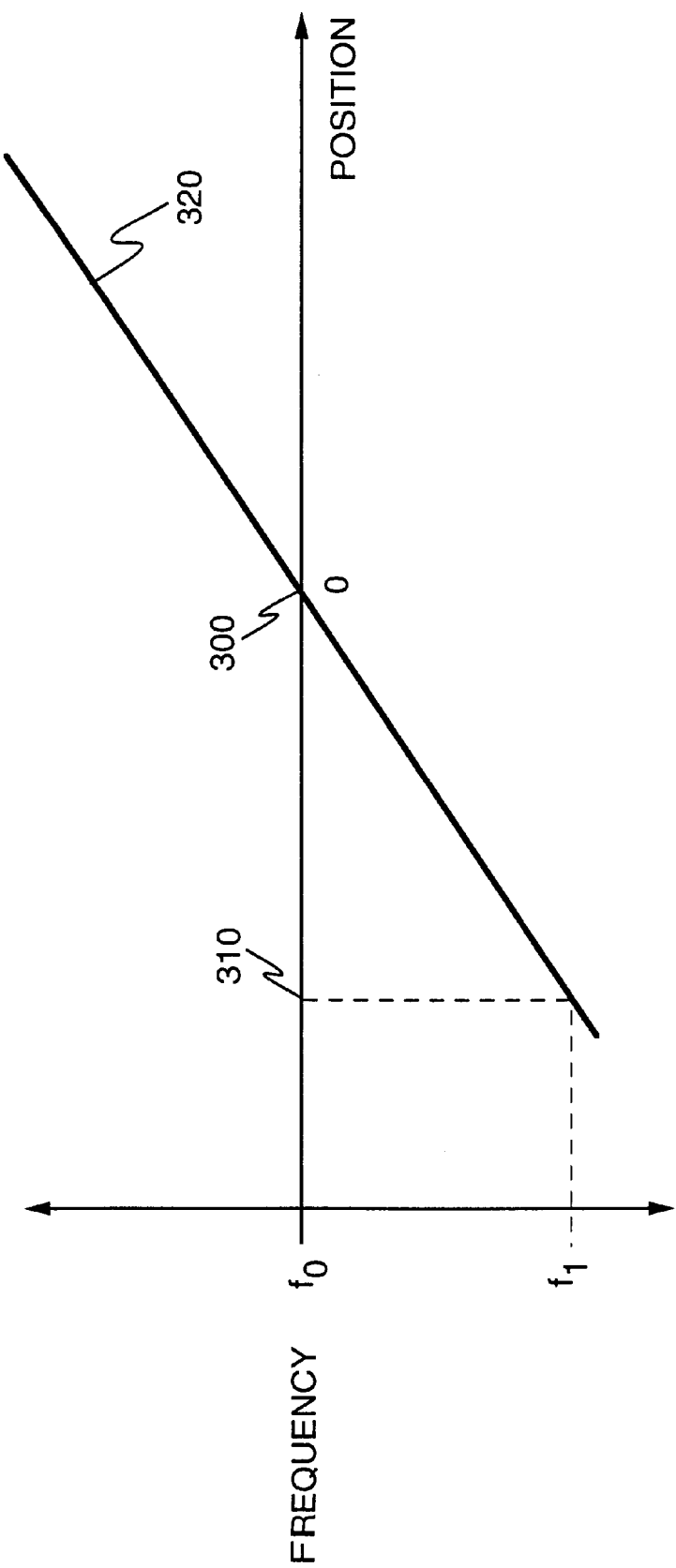
FIG. 4 is a graph of MR resonance versus position along a single axis in the presence of an applied magnetic field gradient.
Figure 5:
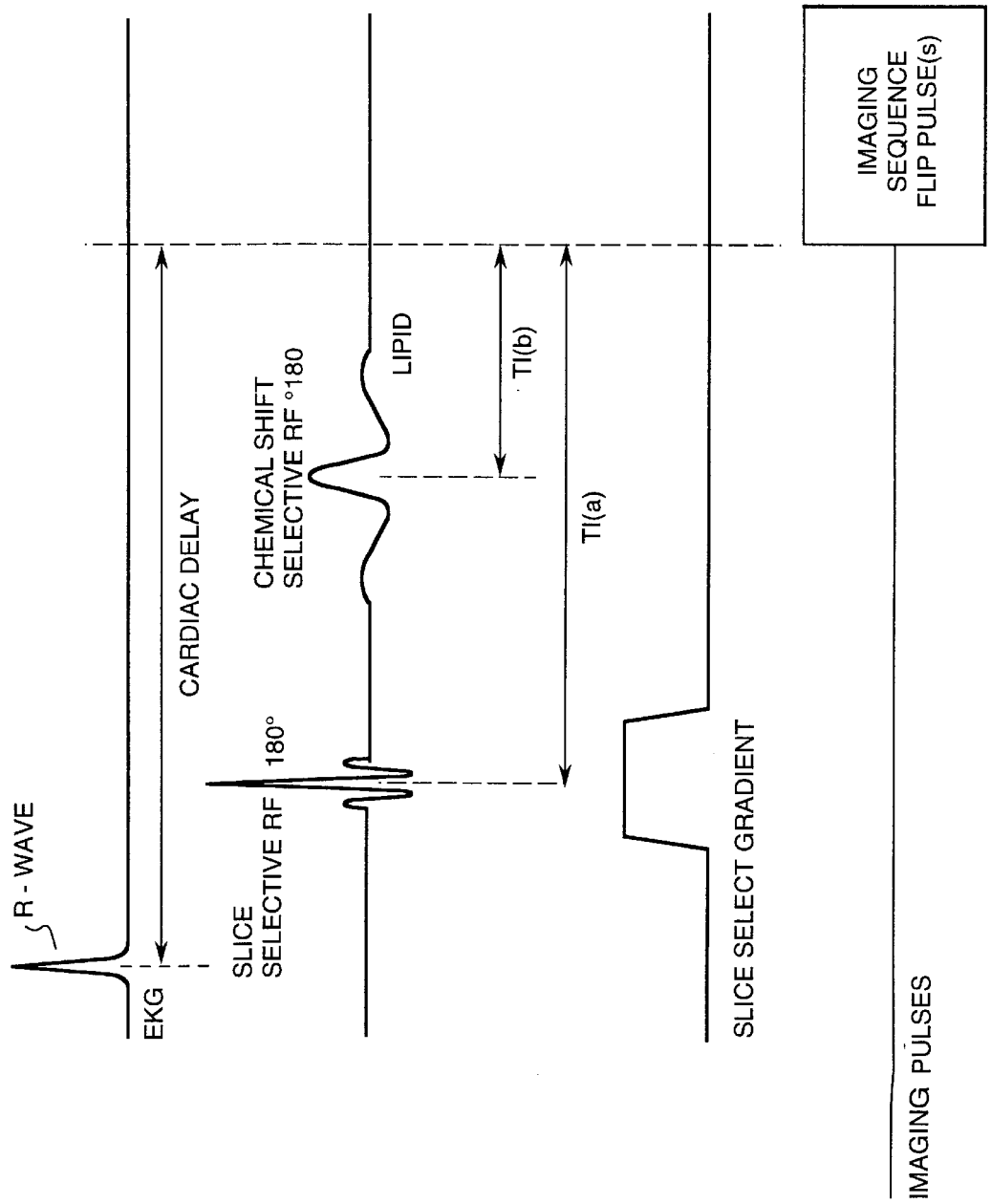
FIG. 5 is a timing diagram showing the relationships between selective RF pulses, magnetic field gradient pulses, and imaging pulses for a first embodiment of the invention.

Referring now to FIG. 4, the Larmor frequency of a spin is shown to be substantially proportional to its position when a magnetic field gradient is applied. A spin located at a center point 300 of the gradient coil (130 of FIG. 1) precesses at a Larmor frequency $f_0$. The Larmor frequency $f_0$ at point 300 of a specific type of nuclear spin is determined by the static magnetic field generated by the magnet (125 of FIG. 1). A spin at a location 310 has a Larmor frequency $f_1$ determined by the sum of the static magnetic field and the additional magnetic field created at that location by the magnetic field gradient coil (130 of FIG. 1). Since the gradient coil response 320 is substantially linear, the Larmor frequency of spin is substantially proportional to position. This relationship between Larmor frequency and spin position is used to create an MR image. MR response signals generated in response to the RF and magnetic field gradient pulses are detected by external RF coil 140 or an alternate receive coil. A presently preferred MR pulse sequence and its pulse timing are illustrated in FIG. 5.

Prior to imaging, the subject's blood is treated with a suitable contrast enhancing agent such as a chelated gadolinium compound, typically Gd-DTPA. The subject 100 has his cardiac cycle monitored by an ECG monitor (not shown). The ECG monitor detects an R-wave, such as the R-wave shown in FIG. 5. A selected time after the detection of an R-wave, the MR scanner applies a slice-selective inversion pulse followed by a chemical shift selective inversion pulse. An inversion pulse reverses the direction of the magnetic moment of the nuclei that are aligned in the permanent magnetic field B0. Upon application of the inversion pulse, the nuclear spins reverse direction so that their magnetic moment is temporarily aligned opposite to the direction of B0. A slice select gradient is applied simultaneously with the first inversion pulse. In this method, a first, slice-selective pulse inverts the magnetization for all materials within the designated slice, including blood, lipid tissue, and myocardial tissue. A subsequent, second, chemical shift selective pulse inverts the spin magnetization of only lipids. The timing of the two inversion pulses is chosen so that the longitudinal magnetization of the lipid and the myocardial tissues are approximately zero at the beginning of the imaging sequence. Because the blood has a different $T_1$ than myocardial tissue, signals arising from the blood will not be completely suppressed, particularly if the blood has been mixed with a $T_1$ relaxation agent such as Gd-DTPA. In addition, when the blood vessel is oriented largely orthogonal to the inversion slice, uninverted blood will enter the imaging plane before the start of the imaging sequence, yielding an even stronger signal for blood.

Figure 6:
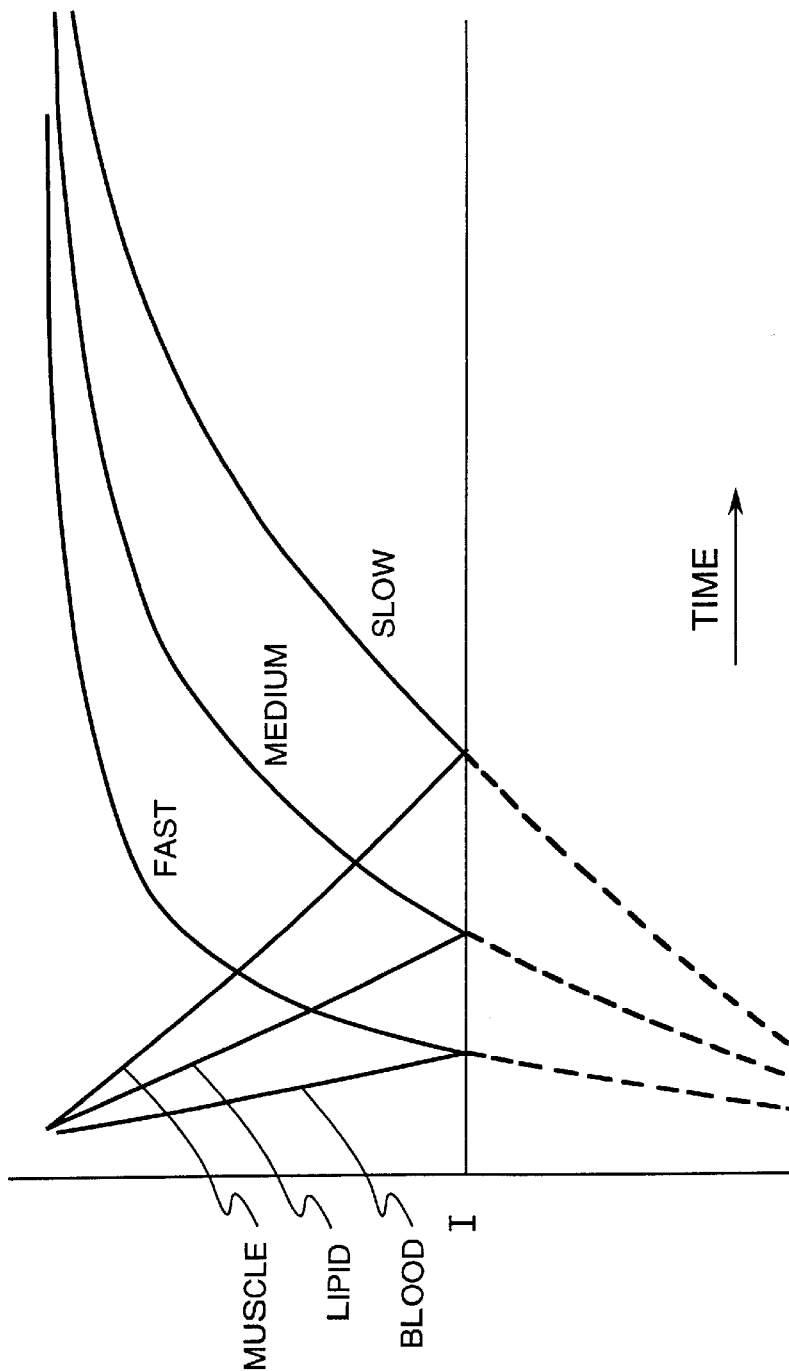
FIG. 6 is a graph showing the relative rates of recovery of myocardium, lipid and blood in response to an inversion signal.

FIG. 6 illustrates the different rates of return of longitudinal spin magnetization to equilibrium following an inversion pulse applied to blood, myocardium, and lipid. As indicated in FIG. 6, doped blood is the fastest of the three materials to return to equilibrium. Lipid has an intermediate rate of return and myocardium has the slowest rate of return. These differential rates of return to equilibrium are used in combination with the slice-selective and chemical shift selective pulses to provide a high contrast image of blood with respect to myocardium.

Figure 7:
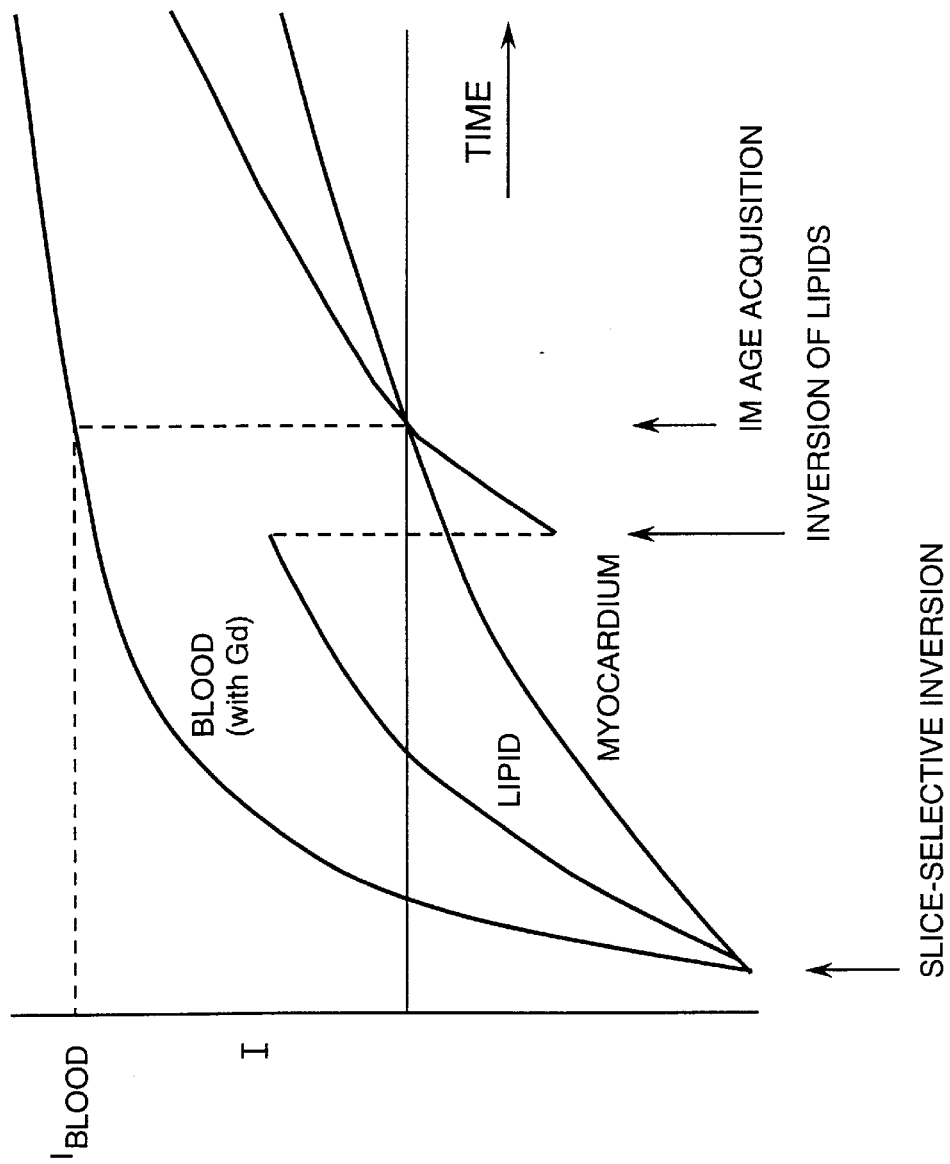
FIG. 7 is a graphic illustration of a first embodiment of the invention applying slice-selective and chemical selective inversion pulse.

Turning to FIG. 7, there is shown the effect of the sequence of the slice-selective and chemical shift selective pulses when applied to the subject 100. Again, an ECG monitor detects an R-wave of the subject 100. The first inversion pulse inverts the magnetization of myocardium, fat, and Gd-DTPA blood within the slice. The magnetization of the blood quickly returns to its equilibrium value while the myocardium returns more slowly. The second chemical shift selective inversion pulse inverts the lipid magnetization, but not the magnetization of the blood or the myocardium. That second, chemical shift selective inversion pulse is timed so that the lipid and the myocardium have about zero longitudinal magnetization during the imaging portion of the sequence. The imaging portion of the sequence is selected to occur subsequent to the second, chemical shift selective inversion pulse and at or about the time the magnetization of the lipid and the myocardium are about 0. Note that at the time of imaging, the magnetization of blood is relatively strong. The imaging sequence includes one or more detection RF pulses, whose tip angles may range from roughly 20°–90°, depending on the specific embodiment. Since the blood is at or near equilibrium and the myocardium and lipid are near zero, the received signals following the detection RF pulse(s) will provide a high contrast image of the blood with respect to the myocardium and lipid. The imaging sequence may also include either an echo-planar pulse sequence or a segmented fast gradient echo imaging pulse sequence.

The method also includes replacing one or more of the inversion pulses by an RF pulse with tip angle less than 180° but greater than 90°, followed by one or more gradient pulses to dephase residual transverse magnetization. The delay time between the RF pulse and the imaging sequence is accordingly shortened so that the nulling of magnetization will occur during the imaging sequence.

Without gadolinium the $T_1$ of blood at 1.5 Tesla is 1200 ms. With a triple dose of Gd-DTPA, the $T_1$ of blood can be reduced to less than 300 ms. The $T_1$ of myocardium is also reduced somewhat after a Gd-DTPA injection since some Gd-DTPA is retained by the muscle. However, the reduction in $T_1$ is relatively minor. Once blood pool Gd agents are approved for human use, it will be possible to reduce the $T_1$ of blood even further without affecting the $T_1$ of myocardium.

Almost any imaging sequence can be employed although those which can be applied quickly will probably be the most useful. In addition to the basic method described above, variations are also possible. These variations include, for example:

A) inverting a slice which is thicker than the imaging slice to compensate for motion of, e.g., the heart between the slice-selective inversion and the imaging sequence.

B) inverting a slice which is offset from the imaging slice to compensate for motion of, e.g., the heart between the slice-selective inversion and the imaging sequence.

C) inverting a slice which is orthogonal to the imaging slice rather than coincident with it, to allow for time-of-flight effects in vessels which are largely in the imaging plane.

D) inverting multiple parallel slices or slabs orthogonal to the imaging slice, to allow for time-of-flight effects in vessels which are largely in the imaging plane.

E) doing D multiple times with offset slabs to remove any gaps left in the vessels.

F) utilizing an inversion pulse which is simultaneously spectrally and spatially selective.

G) using the invention for imaging coronary arteries.

H) using the invention in conjunction with a stress agent, while imaging the heart.

I) using the invention for angiographic imaging in the neck, abdomen, and extremities.

J) applying the invention with or without the use of contrast agent to lower the T1 of blood.

K) selecting alternative delay times so that the resulting images contain only signals from lipid or myocardium rather than blood.

Figure 8:
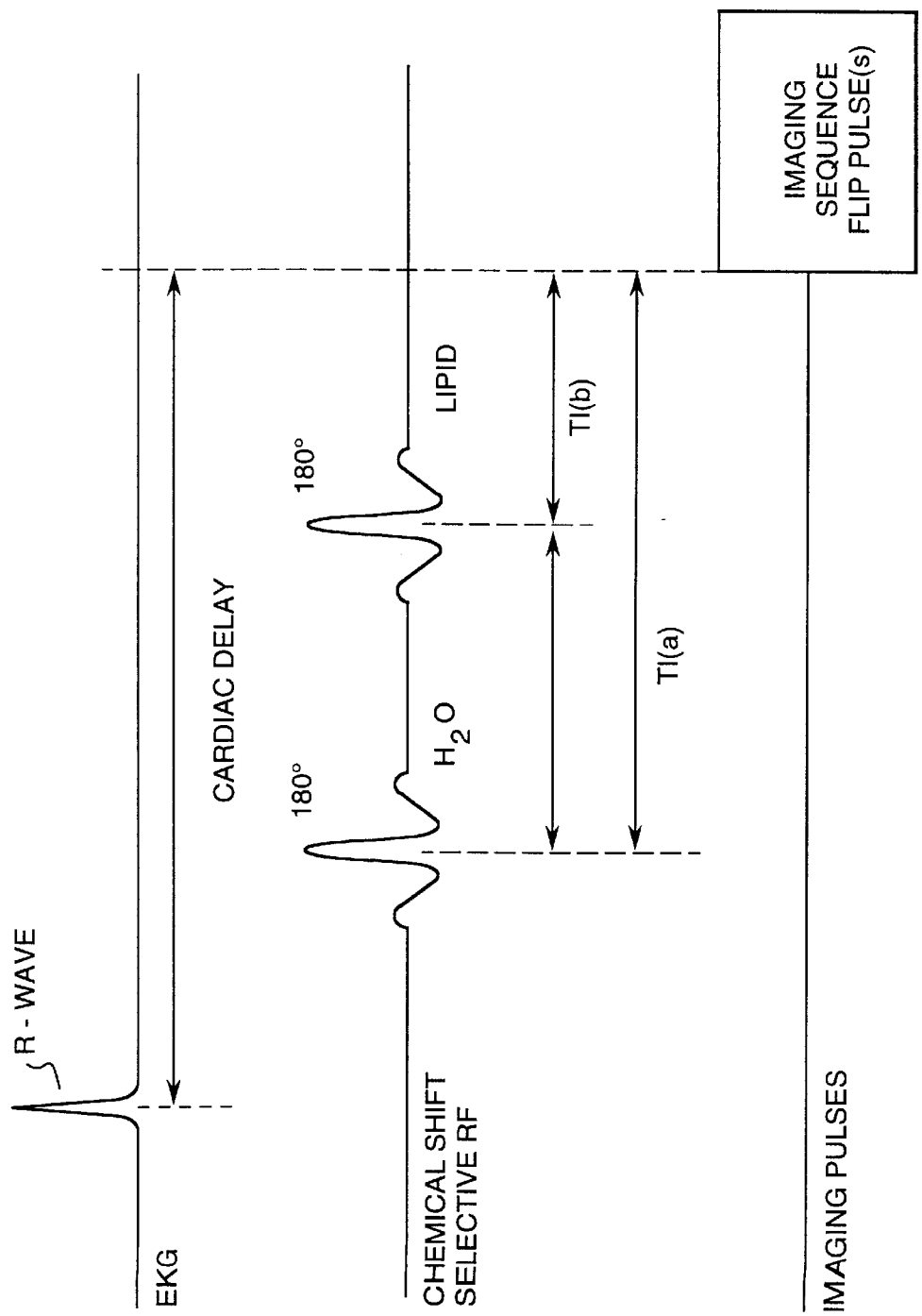
FIG. 8 is a timing diagram showing the relationships between RF pulses, magnetic field gradient pulses, and imaging pulses for a second embodiment of the invention.
Figure 9:
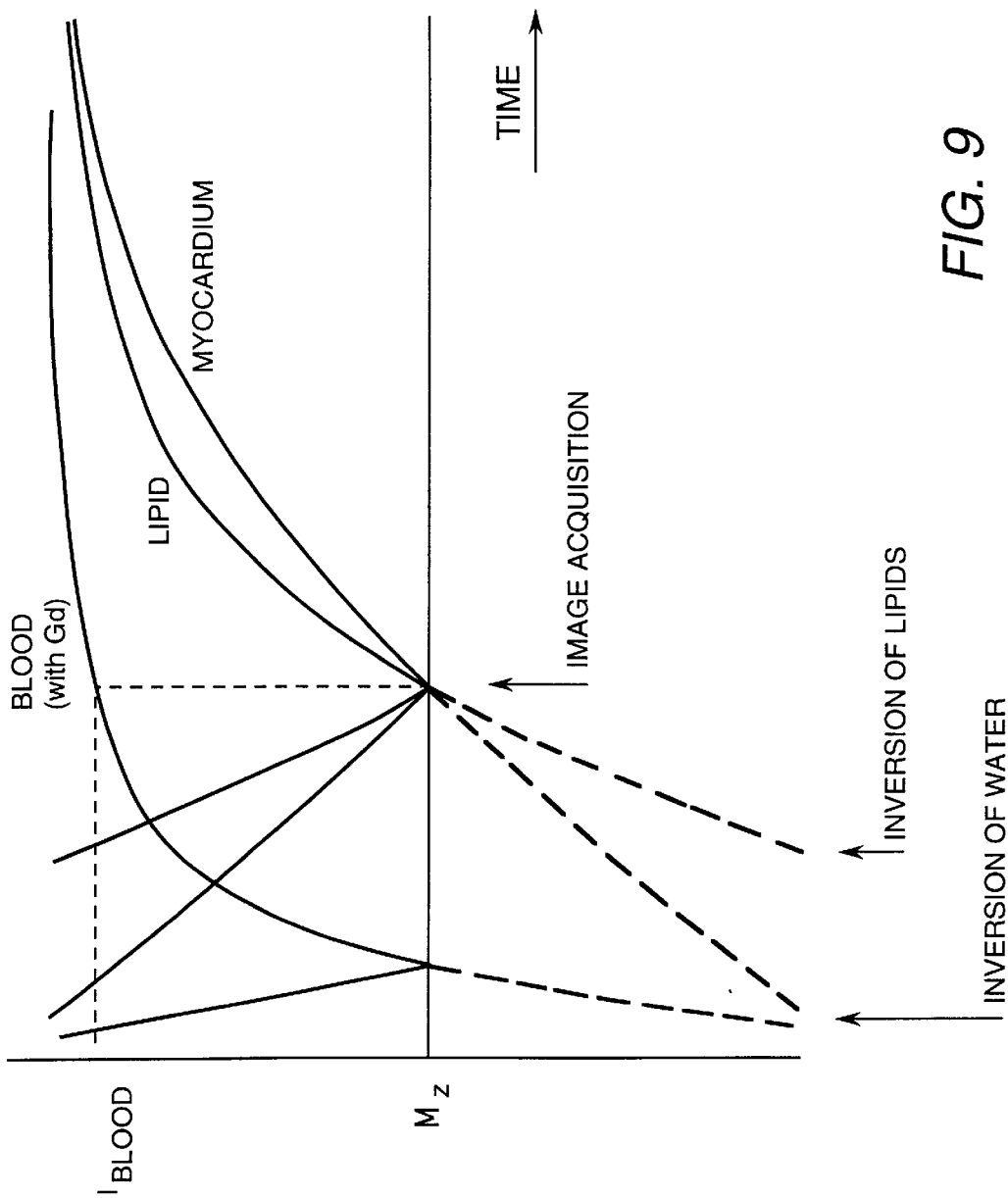
FIG. 9 is a graphical illustration showing the relative recovery times for blood, myocardium, and lipid subjected to the two chemical inversion pulses indicated in FIG. 8.

A second embodiment of the invention is shown in FIGS. 8–9. The second embodiment of the invention applies two chemical shift selective pulses. The first chemical shift selective pulse inverts the spin magnetization of water. As a result, that pulse will invert magnetization for both blood and myocardium. The second inversion pulse inverts the spin magnetization of lipid tissue. The timing of the inversion pulse is chosen to make the longitudinal magnetization of the lipid and myocardium approximately zero at the beginning of the imaging sequence. Because blood has a different $T_1$ than myocardium, however, signals arising from blood will not be completely suppressed, particularly if the blood has been mixed with a $T_1$ relaxation agent such as Gd-DTPA. It will be recalled that blood and myocardial tissue respond to an inversion pulse as shown in FIG. 6. So, blood has the fastest response and myocardium has the slowest response. The true longitudinal magnetization is negative after an inversion pulse, as shown by the dotted lines. Imaging may occur during the time when the magnetization is positive as shown by the solid lines. As shown in FIG. 9, the first chemical shift selective pulse inverts the magnetization of both myocardium and Gd-doped blood. The magnetization of blood returns quickly to its equilibrium value while the myocardium returns more slowly. The second inversion pulse inverts the lipid magnetization. The second inversion pulse is timed to occur so that the lipid and myocardium will have zero longitudinal magnetization during the imaging portion of the sequence. At that time, the longitudinal magnetization of blood is relatively strong. Since the blood is at or near equilibrium and the myocardium and lipid are near zero, the received signals following the detection RF pulse(s) will provide a high contrast image of the blood with respect to the myocardium and lipid. As pointed out in connection with the first embodiment, gadolinium doping can enhance the $T_1$ response of blood in an imaging operation.

The method also includes replacing one or more of the inversion pulses by an RF pulse with tip angle less than 180° but greater than 90°, followed by one or more gradient pulses to dephase residual transverse magnetization. The delay time between the RF pulse and the imaging sequence is accordingly shortened so that the nulling of magnetization will occur during the imaging sequence.

Almost any imaging sequence can be employed, although those methods which traverse the time-domain image-encoding space quickly will probably be the most useful. Several variations of the invention method are possible. These variations include:

A) use of inversion pulses which are both spatially selective and chemical-shift selective.

B) use of additional inversion pulses for suppression of other types of tissue.

C) incorporation of motion compensation schemes such as phase-encoding ordering and navigator echoes to minimize artifacts due to motion.

D) extension of the pulse sequence to three spatial dimensions

E) image acquisition of a projection rather than a thin slice.

F) adaptation of the sequence for perfusion imaging using bolus contrast injections.

G) use of the sequence without cardiac triggering (useful for steady flow conditions).

H) use of the sequence in conjunction with an agent or activity inducing cardiac stress.

I) the use of an echo planar imaging sequence.

J) the use of a segmented fast gradient echo sequence.

K) the extension of these methods by incorporating additional inversion pulses to suppress additional unwanted tissues in the image.

L) modification of the flip angle of one or more inversion pulses followed by the application of one or more gradient pulses to dephase residual transverse magnetization, and the shortening of delay times after inversion to maintain the nulling characteristics of the inversion pulses.

Having disclosed the preferred embodiments of the invention along with numerous variations of implementing those embodiments, those skilled in the art will appreciate that still further changes, additions, and alterations may be made to the invention as described above without departing from the spirit and scope of the invention as set forth in the following claims.

We claim:

1. A method for magnetic resonance imaging of a sample comprising three components including muscle tissue, lipid tissue and blood and generating an image showing contrast between blood and muscle tissue and suppressing an image of the lipid tissue, consisting essentially of the steps of:

placing the sample in a substantially uniform magnetic field for orienting the longitudinal magnetization of the muscle tissue, the lipid tissue, and the blood in the longitudinal direction of the magnetic field;

applying a first inversion pulse for inverting the longitudinal magnetization of at least two of the components;

applying a second inversion pulse for inverting the longitudinal magnetization of the lipid tissue;

applying at least one detection RF pulse to measure the remaining amount of longitudinal magnetization of the blood; and capturing an image of the sample when the longitudinal magnetization of the muscle tissue and lipid tissue are about zero.

2. The method of claim 1 including the step of administering a contrast agent prior to the step of applying the first inversion pulse.

3. The method of claim 1 wherein the first inversion pulse is a slice selective inversion pulse for inverting the longitudinal magnetization of the muscle tissue, lipid tissue and blood.

4. The method of claim 1 wherein the first inversion pulse is a first chemical shift selective inversion pulse for inverting the longitudinal magnetization of the blood and the muscle tissue.

5. The method claim 1 wherein at least one of the inversion pulses comprises an RF pulse with tip angle less than 180° but greater than 90°, said inversion pulses being followed by at least one gradient pulse to dephase residual transverse magnetization, and wherein the time between the RF pulse and the imaging sequence is sufficiently short so that the magnetization reaches zero during the imaging sequence.

6. The method of claim 1 wherein at least the second inversion pulse comprises an RF pulse with said predetermined tip angle less than 180° but greater than 90°, said RF pulse with a predetermined tip angle being followed by a gradient pulse to dephase residual transverse magnetization.

7. The method of claim 6 wherein the at least one detection RF pulse is applied at a time when the longitudinal magnetization of the muscle and lipid tissue are about zero.

8. A method for magnetic resonance imaging of a subject comprising muscle tissue, lipid tissue and blood and generating an image showing contrast between blood and muscle tissue and suppressing an image of the lipid tissue, consisting essentially of the steps of:

placing the subject in a substantially uniform longitudinal magnetic field for orienting the longitudinal magnetization of the muscle tissue, the lipid tissue, and the blood in the longitudinal direction of the magnetic field;

applying a first inversion pulse for inverting the longitudinal magnetization of the muscle tissue, lipid tissue and blood in a selected slice of the subject;

applying a second inversion pulse for inverting the longitudinal magnetization of the lipid tissue, wherein the second inversion pulse is chemical shift selective;

applying at least one detection RF pulse to measure the remaining amount of longitudinal magnetization of the blood; and capturing an image of the subject when the longitudinal magnetization of the muscle and lipid tissue are about zero.

9. The method of claim 8 including the step of administering a contrast agent prior to the step of applying the first inversion pulse.

10. The method of claim 8 wherein the at least one detection RF pulse is selected to rotate the longitudinal magnetization of the muscle tissue, lip tissue and blood 90 degrees.

11. The method of claim 8 wherein the second inversion pulse follows the first inversion pulse after a sufficient time to allow the longitudinal magnetization of the lipid tissue to return to zero at about the same time as the longitudinal magnetization of the muscle tissue returns to zero.

12. The method of claim 8 comprising the further steps of monitoring cardiac cycles of the subject, detecting an R-wave, and applying the first slice selective pulse at a selected time after detecting said R-wave.

13. The method of claim 8 wherein the slice selective pulse is oriented transverse to the direction of the flow of blood in the subject.

14. The method of claim 8 including the step of treating the blood with gadolinium before applying said first inversion pulse.

15. The method of claim 8 including the step of applying the at least one detection RF pulse to the subject at about the time the longitudinal magnetization of the muscle tissue and the lip tissue are about zero.

16. The method of claim 15 comprising the further step of generating an image of blood in the subject.

17. The method of claim 8 wherein the last two steps comprise an echo-planar imaging pulse sequence.

18. The method of claim 8 wherein the last two steps comprise a segmented fast gradient echo imaging pulse sequence.

19. A method for magnetic resonance imaging of a subject comprising muscle tissue, lipid tissue and blood and generating an image showing contrast between blood and muscle tissue and suppressing an image of the lipid tissue consisting essentially of the steps of:

placing the subject in a substantially uniform longitudinal magnetic field for orienting the longitudinal magnetization of the muscle tissue, the lipid tissue, and the blood in the longitudinal direction of the magnetic field;

applying a first chemical shift selective inversion pulse for inverting the longitudinal magnetization of the blood and the muscle tissue;

applying a second chemical shift inversion pulse for inverting the longitudinal magnetization of the lipid tissue;

applying at least one detection RF pulse to measure the remaining amount of longitudinal magnetization of the blood; and capturing an image of the subject when the longitudinal magnetization of the muscle and lipid tissue are about zero.

20. The method of claim 19 comprising the further step of treating the blood with a contrast agent before applying the first chemical shift selective inversion pulse.

21. The method of claim 19 wherein the at least one detection RF pulse is selected to rotate the longitudinal magnetization of the muscle tissue, lipid tissue and blood 90 degrees.

22. The method of claim 19 wherein the second inversion pulse follows the first inversion pulse after a sufficient time to allow the longitudinal magnetization of the lipid tissue to return to zero at about the same time the longitudinal magnetization of the muscle tissue returns to zero.

23. The method of claim 19 comprising the further step of monitoring cardiac cycles of the subject, detecting an R-wave and applying the first chemical shift selective inversion pulse at a selected time after detecting said R-wave.

24. The method of claim 19 wherein the first chemical shift selective inversion pulse is oriented transverse to the direction of the flow of blood in the subject.

25. The method of claim 19 including the step of treating the blood with gadolinium before applying said first chemical shift selective inversion pulse.

26. The method of claim 19 including the step of applying the at least one detection RF pulse to the subject at about the time the longitudinal magnetization of the muscle tissue and the lip tissue are about zero.

27. The method of claim 26 wherein the step of capturing an image of the subject comprises generating as the image a display of blood in the subject.

28. The method of claim 19 wherein the last two steps comprise an echo-planar imaging pulse sequence.

29. The method of claim 19 wherein the last two steps comprise a segmented fast gradient echo imaging pulse sequence.

* * * * *